(12) United States Patent
Kearney (10) Patent No.: US 10,771,030 B2
(45) Date of Patent: Sep. 8, 2020

(54) PHASE-LOCKED LOOP WITH ADJUSTABLE BANDWIDTH

(71) Applicant: Analog Devices International Unlimited Company, Limerick (IE)

(72) Inventor: Niall Kevin Kearney, Cork (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/546,662

(22) Filed: Aug. 21, 2019

(65) Prior Publication Data

US 2020/0067475 A1 Feb. 27, 2020

Related U.S. Application Data

(60) Provisional application No. 62/722,394, filed on Aug. 24, 2018.

(51) Int. Cl.
| | | |
|---|---|---|
| *H03G 3/34* | (2006.01) | |
| *H03L 7/107* | (2006.01) | |
| *H03F 3/181* | (2006.01) | |
| *H03L 7/095* | (2006.01) | |
| *H03L 7/093* | (2006.01) | |

(52) U.S. Cl.
CPC ............ *H03G 3/344* (2013.01); *H03F 3/181* (2013.01); *H03L 7/093* (2013.01); *H03L 7/095* (2013.01); *H03L 7/1072* (2013.01)

(58) Field of Classification Search
CPC ......... H03G 3/344; H03F 3/181; H03L 7/093; H03L 7/095; H03L 7/1072
See application file for complete search history.

(56) References Cited

U.S. PATENT DOCUMENTS

| | | | | |
|---|---|---|---|---|
| 4,823,361 | A | * | 4/1989 | Yoshida ................. H04L 27/38 375/235 |
| 6,002,352 | A | * | 12/1999 | El-Ghoroury ......... H03M 1/208 341/139 |
| 6,047,170 | A | | 4/2000 | Paulsen et al. |
| 6,476,681 | B1 | | 11/2002 | Kirkpatrick |
| 6,580,329 | B2 | | 6/2003 | Sander |
| 8,437,721 | B2 | | 5/2013 | Zeng et al. |
| 9,608,679 | B2 | | 3/2017 | Cheah et al. |

(Continued)

FOREIGN PATENT DOCUMENTS

| | | |
|---|---|---|
| CN | 104215981 B | 3/2017 |
| WO | WO 2012/008197 A1 | 1/2012 |

OTHER PUBLICATIONS

"Internet of Things by the Numbers: Market Estimates and Forecasts", Forbes, http://www.forbes.com/sites/gilpress/2014/08/22/internet-of-thing-by-the-numbers-market-estimate-and-forceasts/#5534a7832dc9.

(Continued)

*Primary Examiner* — Nguyen T Vo
(74) *Attorney, Agent, or Firm* — Knobbe, Martens, Olson & Bear, LLP (57) ABSTRACT

Aspects of this disclosure relate to a VLIF receiver with automatic phase noise adjustment. The presence of an interfering signal is sensed within a bandwidth around a desired channel frequency. Then the local oscillator phase noise is automatically adjusted to optimize blocking. The phase noise adjustment includes increasing the bandwidth of a phase-locked loop.

20 Claims, 10 Drawing Sheets

(56) References Cited

U.S. PATENT DOCUMENTS

| | | | |
|---|---|---|---|
| 2005/0073450 A1* | 4/2005 | Kim .................... | H03G 3/3068 |
| | | | 341/119 |
| 2005/0219001 A1* | 10/2005 | Booth .................. | H03L 7/0891 |
| | | | 331/17 |
| 2008/0191759 A1* | 8/2008 | Neurauter ............ | H03D 13/004 |
| | | | 327/157 |
| 2010/0093279 A1 | 4/2010 | Linksy et al. | |

OTHER PUBLICATIONS

Kong, et al., "A 2.4GHz 4mW Inductorless RF Synthesizer," IEEE Journal of Solid-State Circuits, vol. 52, No. 8, Aug. 2017.
"Phaselock Techniques," F. M. Gardner, 2005.

* cited by examiner

PHASE-LOCKED LOOP WITH ADJUSTABLE BANDWIDTH

CROSS-REFERENCE TO RELATED APPLICATIONS

The present application claims priority to U.S. Provisional Patent Application No. 62/722,394, filed Aug. 24, 2018, and titled "VERY LOW INTERMEDIATE FREQUENCY (VLIF) RECEIVER WITH ADAPTIVE PHASE NOISE," the entirety of which is hereby incorporated herein by reference.

FIELD OF DISCLOSURE

The disclosed technology relates to receivers and transceivers.

BACKGROUND

The ideal local oscillator (LO) for a down-conversion stage in a receiver would have sufficiently low phase noise at all offset frequencies to meet the required performance specifications. In practical designs, tradeoffs are involved. In a phase-locked loop (PLL), key tradeoffs are the bandwidth and the suppression of close-in voltage controlled oscillator (VCO) noise versus the peaking of quantization noise at higher offsets, such as offsets greater than the closed loop bandwidth.

SUMMARY OF THE DISCLOSURE

The innovations described in the claims each have several aspects, no single one of which is solely responsible for the desirable attributes. Without limiting the scope of the claims, some prominent features of this disclosure will now be briefly described.

One aspect of this disclosure is a phase-locked loop having adjustable bandwidth to enhance adjacent channel rejection and blocking performance. The phase-locked loop comprises a phase detector comprising an output, a loop filter comprising an input in communication with the output of the phase detector, and a bandwidth control circuit configured to operate the loop filter in a first configuration having a first bandwidth when no interferer is detected and configured to operate the loop filter in a second configuration having a second bandwidth when an interferer is detected. The second bandwidth is greater than the first bandwidth.

The phase-locked loop can be a Type-I phase-locked loop. The phase-locked loop can include an oscillator in communication with the loop filter. The oscillator can be configured to generate an oscillating signal based on an output of the loop filter. The loop filter can include at least one switch. The bandwidth control circuit can control a state of the at least one switch in response to detecting the interferer. The bandwidth control circuit can control a bandwidth of the loop filter by controlling a configuration of the loop filter. The second bandwidth can be approximately 1.5 times greater than the first bandwidth. The phase-locked loop can include a delta-sigma multi-stage noise shaping (MASH) modulator in communication with an input of the phase detector.

The loop filter can include at least one switch, at least one resistor and at least one capacitor, and the bandwidth control circuit can control the state of the at least one switch based at least in part on the detection of an interferer to control a configuration of the at least one resistor and the at least one capacitor in the loop filter. Operating the loop filter at the first bandwidth can enhance far-out interferer blocking resilience. Operating the loop filter at the second bandwidth can reduce close-in phase noise to enhance adjacent channel rejection.

Another aspect of this disclosure is a method to adjust the bandwidth of a phase-locked loop in a receiver to enhance adjacent channel rejection and blocking performance of the receiver. The method comprises detecting an interferer in a receive signal prior to channel select filtering, and increasing a bandwidth of a phase-locked loop in a receiver in response to detecting the interferer.

The receiver can be a very low intermediate frequency (VLIF) receiver. The phase-locked loop can be a Type-I phase-locked loop. The method can include operating the phase-locked loop at a default bandwidth when no interferer is detected. Increasing the bandwidth of the phase-locked loop can include increasing the bandwidth from a default bandwidth in a receiver in response to detecting the interferer.

One aspect of this disclosure is a receiver with adaptive phase noise. The receiver comprises antenna configured to transmit and receive radio frequency signals, an interferer detector configured to detect interferers in a received radio frequency signal, a phase-locked loop configured to generate an oscillator signal for use in demodulating the received radio frequency signal, and a bandwidth switch circuit configured to adjust a bandwidth of the phase-locked loop to a first bandwidth when no interferer is detected and to adjust the bandwidth of the phase-locked loop to a second bandwidth that is greater than the first bandwidth when the interferer is detected.

The interferer detector can detect a signal strength of the received radio frequency signal in a receive signal path prior to channel detect filtering. The receiver can include an analog to digital converter configured to digitize a demodulated signal in the receive signal path. The interferer detector can be in communication with an output of the analog to digital converter. The receiver can include a low noise amplifier configured to amplify the received radio frequency signal and an automatic gain control circuit configured to adjust a gain of the low noise amplifier based at least in part on a power level of the detected interferers.

Another aspect of this disclosure is a method of operating a phase-locked loop in a receiver to enhance adjacent channel rejection and blocking performance of the receiver. The method comprises operating a PLL within a receiver with a first loop bandwidth in a first operating condition in which no interferer is detected, and operating the PLL with a second loop bandwidth in a second operating condition in which an interferer is detected, the second loop bandwidth being greater than the first loop bandwidth.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With the exponential growth of wireless traffic in congested spectrum allocations, methods to enhance the interferer resilience of low power, low cost radios is desirable. Further, low power, low cost radios are central to the Internet of Things vision. Given the emergence of Ultra Narrow Band (UNB) as a technology to deliver Low Power Wide Area Networks (LPWANs), the capability to attain very low close-in phase noise is a key differentiating advantage in a transceiver.

To attain the ≥70 dB Adjacent Channel Rejection (ACR) performance used in modern ultra-low data rate transceivers, stringent close-in Phase Noise (PN) suppresses the effect of reciprocally mixed phase noise below an otherwise performance limiting level.

Figure 12:
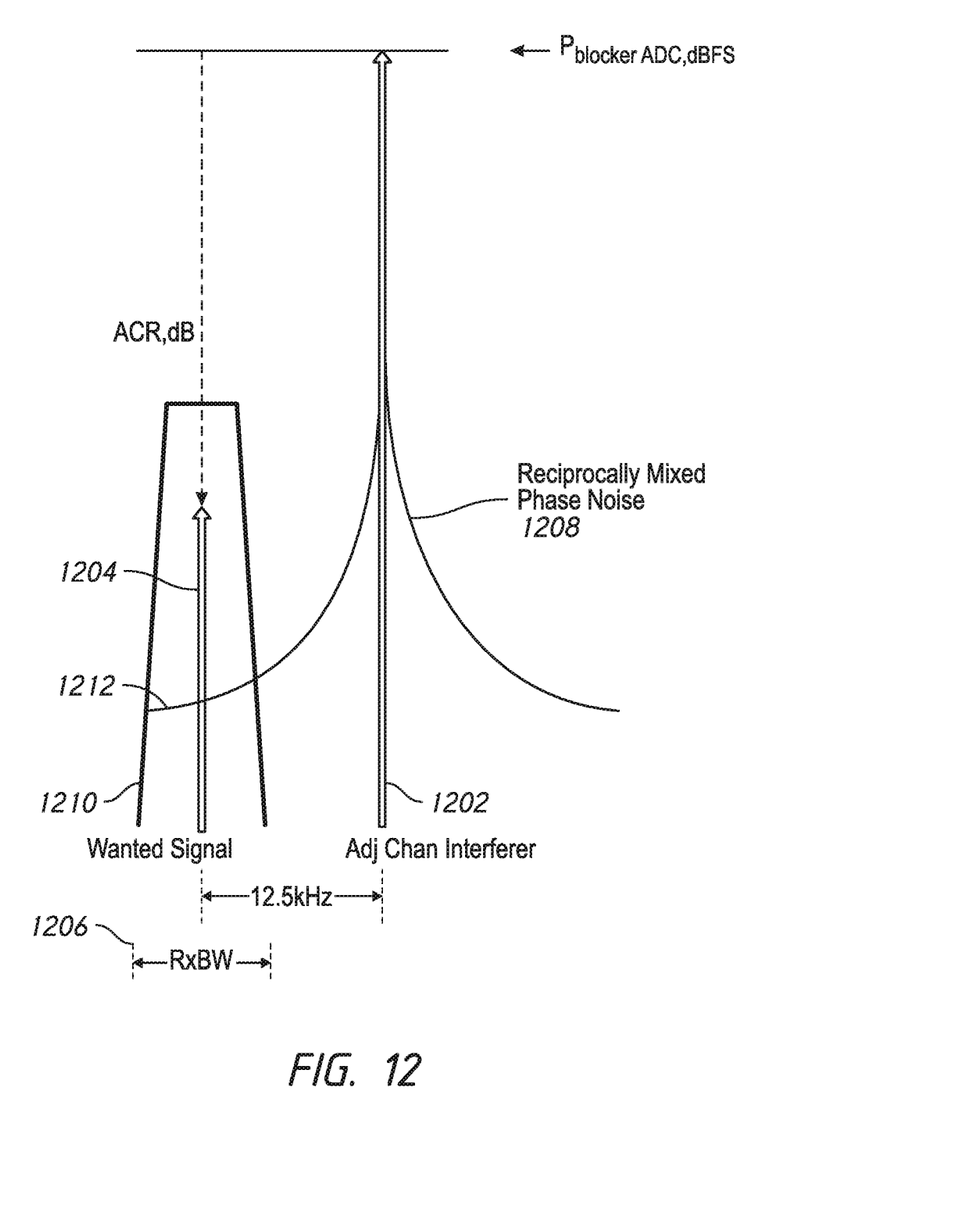
FIG. 12 is a diagram illustrating reciprocal mixed phased noise according to an embodiment.

FIG. 12 is a simplified representation of an adjacent channel interferer 1202 in the receive signal to illustrate reciprocal mixed phase noise according to an embodiment. FIG. 12 shows two sideband noise skirts 1208 around the adjacent channel interferer 1202, which is illustrated in FIG. 12 as being approximately 12.5 kHz from the center frequency 1204 of the receiver channel filter bandwidth 1206. The sideband noise skirts 1208 around the interferer 1202 are generated from mixing the signal from the antenna with the local oscillator signal, which also has these sidebands. Mathematically, the receive signal from the antenna is convolved with the LO signal in the frequency domain, which transfers the sidebands from the LO signal to the interferer 1202. The two sideband skirts 1208 are the reciprocally mixed phase noise. If the wanted signal 1210 is too low relative to the sideband noise 1212 that overlaps into the receiver channel filter bandwidth 1206, then the receiver can lose reception or fail.

Some low power, high performance, integrated radio transceivers use a Type-II charge pump PLL, which uses an external loop filter capacitor component in the nanofarad range. In addition to the external loop filter capacitor being a relatively large component to add to the device, the external loop filter capacitor uses two package pins of the integrated radio transceiver.

Aspects of this disclosure relate to receivers or transceivers that use a Type-I PLL for the LO generation. Type-I phase-locked loops (PLL) can integrate the loop filter while preserving power, provide enhanced ACR and blocking performance, and reduce die area for cost savings by eliminating the need for a large external capacitor and additional package pins. Additionally, by avoiding any off-chip components, bondwire/trace pickup of undesired spurious signals is avoided, where the issue may be spurious degradation of the receiver blocking characteristics.

Aspects of this disclosure relate to increasing the PLL BW in response to detecting an interferer. By increasing PLL BW rather than decreasing it, close in phase noise can be reduced to optimize Adjacent Channel Rejection. Further, by increasing PLL BW rather than decreasing it, the re-settling time incurred in the PLL is reduced. In addition, using a Type-I PLL further enhances the reduction in settling time compared to a Type II PLL, as Type-I PLLs can settle faster than their equivalent BW Type-II counterparts.

A Type-I PLL provides $1^{st}$ order suppression of the VCO phase noise within the bandwidth of the PLL. Close-in, the VCO phase noise typically exhibits a $1/f^3$ characteristic (the flicker dominated region), and so when operating in a Type-I loop, the closed loop VCO in-band noise exhibits a $1/f$ characteristic at low offset frequencies.

Consider the close-in noise. For example, the FCC narrowbanding mandate calls for 6.25 kHz channelization. The VCO noise in a Type-I PLL at this offset, if it is the dominant contributor as it will be in a well-designed PLL, is now set by the bandwidth of the PLL. Increasing the bandwidth of the PLL reduces the close-in noise.

Consider far-out noise. The closed loop bandwidth of the PLL sets the filtering of the quantization noise in the fractional-N loop. This noise is typically noise shaped by employing delta-sigma MASH (multi-stage noise shaping) methods, and tends to peak at a particular offset frequency. The PLL bandwidth is typically designed to suppress this noise to a sufficiently low level to meet specification. A lower PLL bandwidth results in greater suppression of quantization noise. Thus, decreasing the bandwidth of the PLL reduces the far-out noise. Thus, a tradeoff exists between PLL bandwidth and the suppression of in-band VCO noise versus the suppression of out-of-band quantization noise.

The LO phase noise is important for receiver blocking in the presence of interferers. By default, the receiver can operate the PLL generating the LO signal at a first bandwidth, BW1, which is set to optimize far-out interferer blocking resilience. If a close-in interferer is detected, alter the PLL BW to a second bandwidth, BW2, where BW2>BW1, such that close-in phase noise is enhanced to optimize close-in interferer blocking resilience. Close-in interferer blocking resilience may be indicated by the Adjacent Channel Rejection (ACR) specifications of the receiver.

For fast response, the PLL BW switching observation port and decision circuitry can operate prior to any high-order low-bandwidth selectivity filtering, thereby avoiding incurring the associated latency and the knock on impact on minimum preamble requirement for successful packet acquisition, such as for automatic frequency control (AFC), automatic gain control (AGC), and clock and data recovery (CDR) settling. Also envelope ringing effects due to high-Q filtering are avoided, which would further delay the decision to switch PLL BW.

The receiver lineup can be such that filtering attenuates the interferer level faster than the roll off the of phase noise profile of the LO, which can ensure that blocking becomes phase noise limited up to approximately the maximum absolute interferer power level specification.

The PLL BW switching decision circuit can be incorporated into the AGC system such that dynamic range is preserved and the bit error rate/packet error rate (BER/PER) is not compromised in the presence of gain changes or PLL BW changes at offset frequencies in the presence of an interferer.

Figure 1:
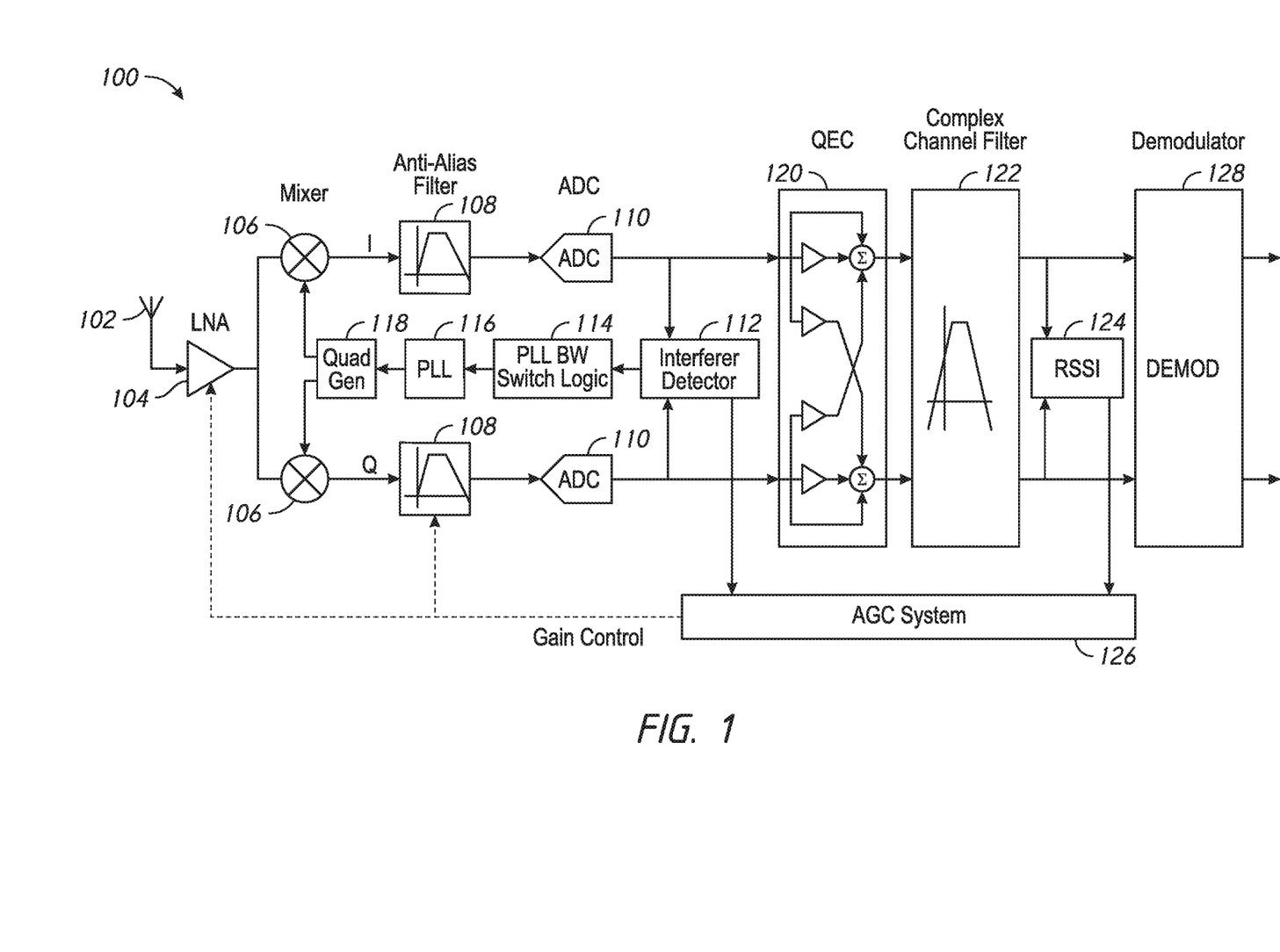
FIG. 1 is a system block diagram of a very low intermediate frequency (VLIF) receiver that includes an interferer detector and phase-locked loop (PLL) bandwidth (BW) switch logic according to an embodiment.

FIG. 1 is a system block diagram of a very low intermediate frequency (VLIF) receiver 100 that includes PLL BW switching in response to interferer detection according to an embodiment. For example, approximately 81.25 kHz is a typical intermediate frequency for low data rate configurations. The illustrated VLIF receiver 100 includes an antenna 102, a low noise amplifier (LNA) 104, mixers 106, anti-aliasing filters 108, analog to digital converters (ADC) 110, an interferer detector 112, PLL BW switch logic 114, a PLL 116, a quadrature signal generator 118, quadrature error correction (QEC) circuitry 120, a complex channel filter 122, a received signal strength indicator (RSSI) 124, an automatic gain control (AGC) system, and a demodulator 128.

The LNA 104 can amplify the RF signal received by the antenna 102. To demodulate the data from the amplified signal, mixers 106 can down-mix or down-convert the amplified signal 104 with signals that are approximately 90 degrees apart in phase and are generated by the quadrature signal generator 118. The mixers 106 can then output signals I and Q that are approximately 90 degrees apart in phase and at a lower frequency, such as the intermediate frequency. The anti-aliasing filters 108 can filter the I and Q mixed signals to remove negative signal components. The ADCs 110 can convert the analog anti-aliased signals to digital signals. The QEC 120 can correct errors in the phase difference between the digital signals. The RSSI 124 can measure the received signal strength of the phase error corrected signals and send an adjustment to the AGC system 126. The AGC system 126 can adjust the gain the LNA 104 based at least in part on the received signal strength. The demodulator 128 can receive and demodulate the phase error corrected signals for further processing in a baseband system (not shown).

The interferer detector 112 can receive the digital signals from the ADCs 110 and determine whether an interferer is present. The PLL BW switch logic 114 can receive the indication from the interferer detector 112 and adjust the BW of the PLL 116 based on the indication of an interferer from the interferer detector 112. The PLL 116 can send a voltage controller oscillator (VCO) signal to the quadrature signal generator 118 and the frequency of the I and Q signals from the quadrature signal generator 118 is based at least in part on the VCO signal. The interferer detector 112 can also send a signal to the ACG system 126 to adjust the gain the LNA 104 based at least in part on the signal strength of the interferer.

Figure 2:
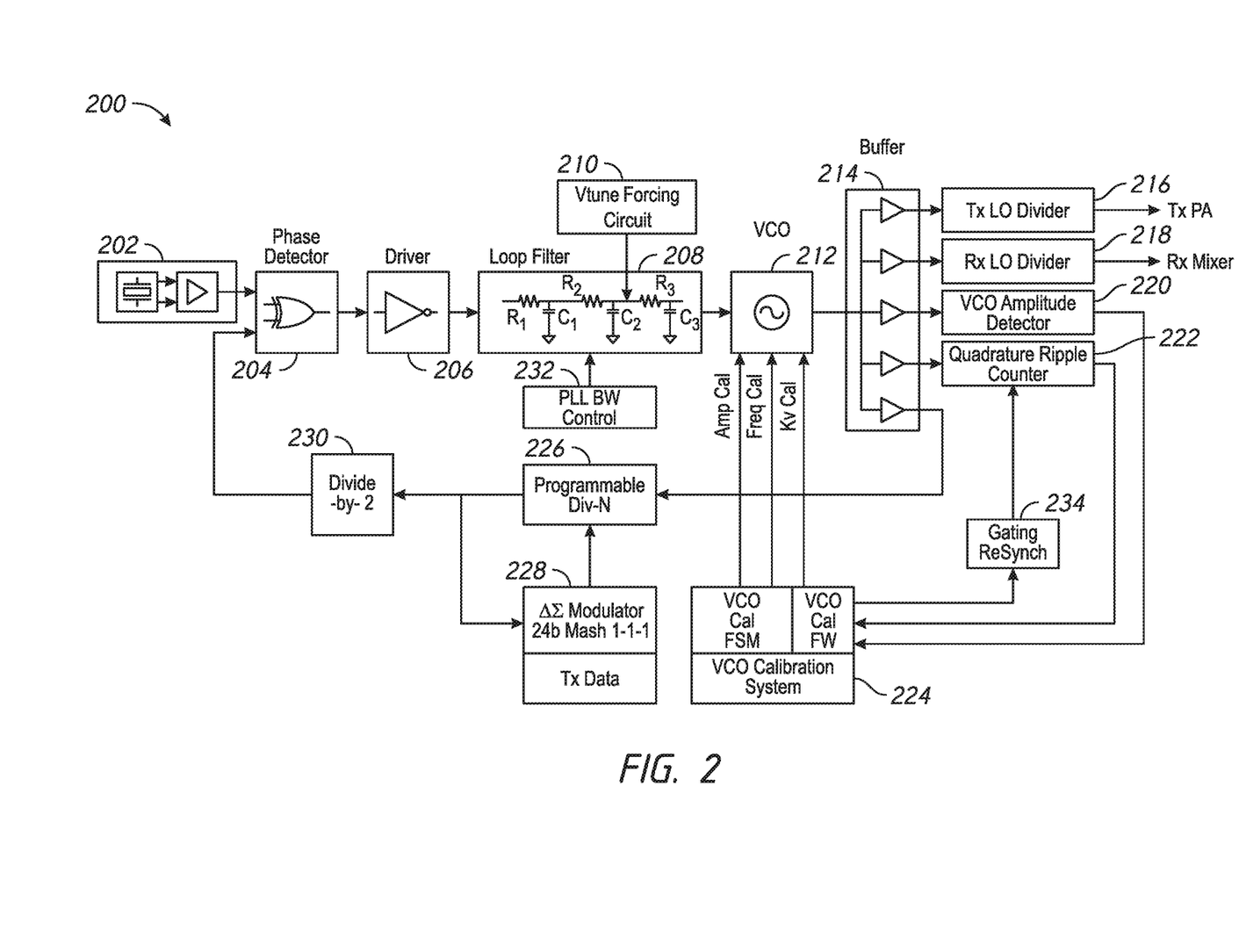
FIG. 2 is a system block diagram of a Type-I PLL that includes a loop filter and PLL bandwidth control circuitry according to an embodiment.

FIG. 2 is a system block diagram of a Type-I PLL 200 according to an embodiment. The illustrated PLL 200 is a $4^{th}$ order PLL and includes a crystal oscillator 202, a phase detector 204, a driver 206, a loop filter 208, a Vtune forcing circuit 210, a VCO 212, buffers 214, a transmit LO divider 216, a receive LO divider 218, a VCO amplitude detector 220, a quadrature ripple counter 222, a VCO oscillator calibration system 224, a programmable divide-by-N divider 226, a delta sigma modulator 228, a divide-by-2 divider 230, PLL BW control circuitry 232 and gating resynch circuitry 234.

The crystal oscillator 202 can generate a clock signal which may be divided or multiplied to provide a reference clock signal to the phase detector 204. The phase detector 204 can detect whether a feedback signal is leading or lagging the reference clock signal. The PLL can be an exclusive or (XOR) PLL, and the phase detector 204 can have XOR functionality. The phase detector 204 can output a phase error information signal to the driver 206. The driver 206 can buffer the phase error information signal.

The loop filter 208 can receive the buffered phase information signal from the driver 206. The loop filter 208 can output a voltage suitable for driving the VCO. The Vtune forcing circuit 210 can apply pre-determined voltages to the loop filter and to a tuning port of the VCO for calibration purposes.

The loop filter 208 can also be configured to control the bandwidth of the PLL 200. The illustrated loop filter 208 is a third order loop filter and includes three resistors, R1, R2, R3, three capacitors, C1, C2, C3, and switches, which are further described in FIGS. 3, 4, and 5. The PLL BW control circuitry 232 controls the switches and adjusts the BW of the PLL 200 in response to interferers. The PLL BW control circuitry 232 can comprise the Interferer Detector 112 and the PLL BW switch logic 114 of FIG. 1. The PLL BW control circuitry 232 can receive an indication of the power-level of the signal at the output of the ADC 110 and adjust the BW of the PLL by controlling the switches in the loop filter 208 based on the indication of the power level of the signal at the output of the ADC 110. The power level of the signal at the output of the ADC 110 can be compared to a threshold to determine whether an interferer is present. The threshold can be programmable.

The VCO 212 can output a clock signal having a frequency that is related to the driving voltage from the loop filter 208. Buffer 214 can buffer the clock signal. The transmit LO divider 216 can divide the buffered clock signal for use in the transmit power amplifier. The receive LO divider 218 can divide the buffered clock signal for use in the receiver mixer, such as the mixers 106 and the quadrature signal generator 118 of FIG. 1. The VCO amplitude detector 220 and the quadrature ripple counter 222 provide amplitude and count information to the VCO calibration system 224.

The VCO calibration system 224 receives the VCO amplitude and the count and provides amplitude, frequency, and temperature calibration inputs to the VCO 212. The VCO calibration system 224 provides an input to the gating resynch circuitry 234, which provides a resynchronization signal to the quadrature ripple counter 222.

The buffered clock signal can be fed into the series of divider circuits 226, 230 to divide the frequency of the buffered clock signal back down to the frequency of the reference clock signal. A feedback signal from the series of divider circuits 226, 230 can be fed back into the phase detector 204 to complete the PLL loop.

The delta sigma modulator 228 can be in communication with the feedback loop. The delta sigma modulator 228 can be configured as an additional feedback loop with the programmable divide by N divider 226 to allow the PLL 200 to operate as a delta-sigma based fractional-N frequency synthesizer. The illustrated delta sigma modulator 228 is a delta sigma MASH modulator 1-1-1 having three cascaded first order delta sigma modulators. In other embodiments, other types of modulators can be used.

Figure 3:
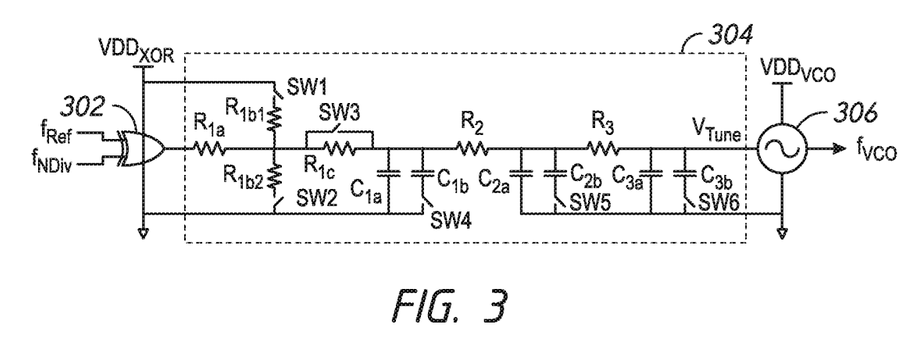
FIG. 3 is a circuit diagram for XOR-PLL bandwidth switching circuitry according to an embodiment.

FIG. 3 is a circuit diagram for XOR-PLL bandwidth switching circuitry 300 according to an embodiment. The illustrated XOR-PLL bandwidth switching circuitry 300 includes a phase detector 302 with XOR functionality, a loop filter 304, and a VCO 306. Loop filter 304 includes resistors, R1a, R1b1, R1b2, R1c, which comprise resistor R1 of FIG. 2. Loop filter 304 further includes resistors R2 and R3, which correspond to resistors R2 and R3 of FIG. 2. Loop filter 304 further includes capacitors C1a, C1b, which comprise capacitor C1 of FIG. 2, capacitors C2a, C2b, which comprise capacitor C2 of FIG. 2, and capacitors C3a, C3b, which comprise capacitor C3 of FIG. 2. Loop filter 304 further includes a plurality of switches, SW1-SW6. In the illustrated loop filter 304, SW1 can be between R1b1 and VDD, SW2 can be between R1b2 and ground; SW3 can be across R1c; SW 4 can be between C1b and ground; SW5 can be between C2b and ground; and SW6 can be between C3b and ground.

The PLL BW switch logic 114 and/or PLL BW control circuitry 232 controls the switches to adjust the BW of the PLL based at least in part on an indication of an interferer from the interferer detector 112.

In the example described next, a ratio of BW2/BW1=3/2 is employed. Note that the damping factor of the closed loop response is preserved due to approximately simultaneous ratiometric switching of a scaling gain factor via potential division, and inverse scaling of pole locations via capacitor switching. For the BW2/BW1=3/2 ratio example, the components are switched according to the table below:

TABLE 1

Ratiometric loop filter component values for BW2/BW1 = 3/2

|  | BW1 | BW2 = 3/2*BW1 |
| --- | --- | --- |
| R1a | R1 | R1 |
| R1b1, R1b2 | 4 R1 | ∞ |
| R1c | R1/3 | 0 |
| C1a | 2/3 C1 | 2/3 C1 |
| C1b | 1/3 C1 | 0 |
| R2 | R2 | R2 |
| C2a | 2/3 C2 | 2/3 C2 |
| C2b | 1/3 C2 | 0 |

TABLE 1-continued

Ratiometric loop filter component values for BW2/BW1 = 3/2

|  | BW1 | BW2 = 3/2*BW1 |
| --- | --- | --- |
| R3 | R3 | R3 |
| C3a | 2/3 C3 | 2/3 C3 |
| C3b | 1/3 C3 | 0 |

Figure 4:
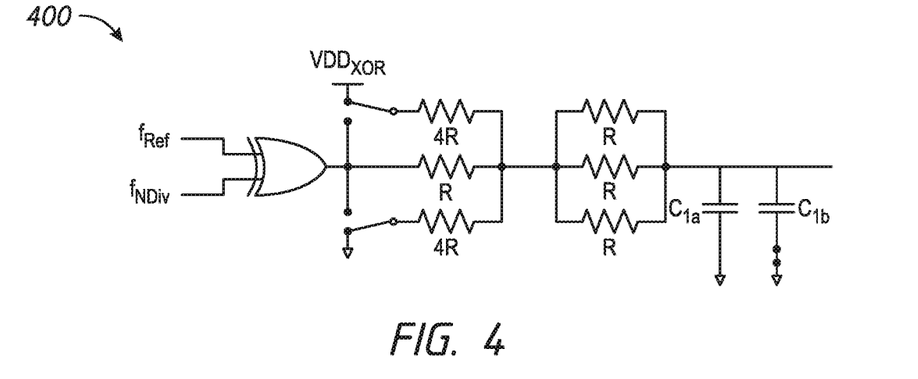
FIG. 4 illustrates constructing the R1a/b/c network portion of the loop filter with unit resistors for the BW1 switch position according to an embodiment.

FIG. 4 illustrates constructing the R1a/b1/b2/c and C1a/b network portion of the loop filter 304 with unit resistors for ratiometric matching for the BW1 switch position to form loop filter 400 according to an embodiment. Cxa/b, where x=1, 2, 3, can be realized with 1/3 unit capacitors.

Figure 5:
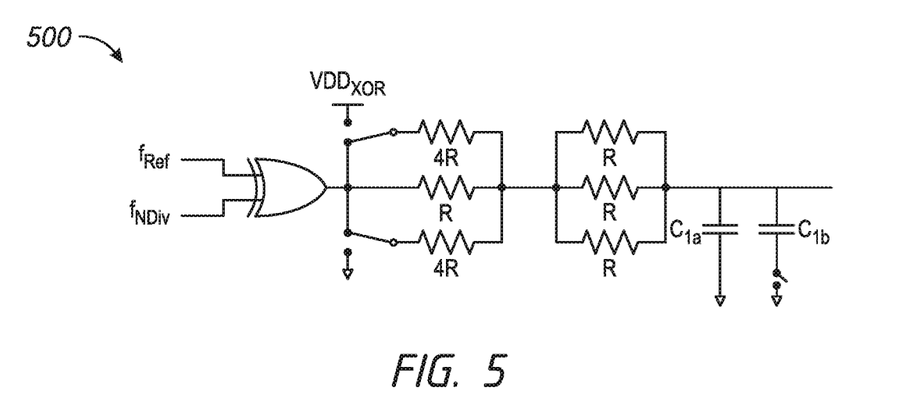
FIG. 5 illustrates constructing the R1a/b/c network portion of the loop filter with unit resistors for the BW2 switch position according to an embodiment.

FIG. 5 illustrates constructing the R1a/b2/b2/c and C1a/b network portion of the loop filter 304 with unit resistors for ratiometric matching for the BW2 switch position to form loop filter 500 according to an embodiment.

Figure 6:
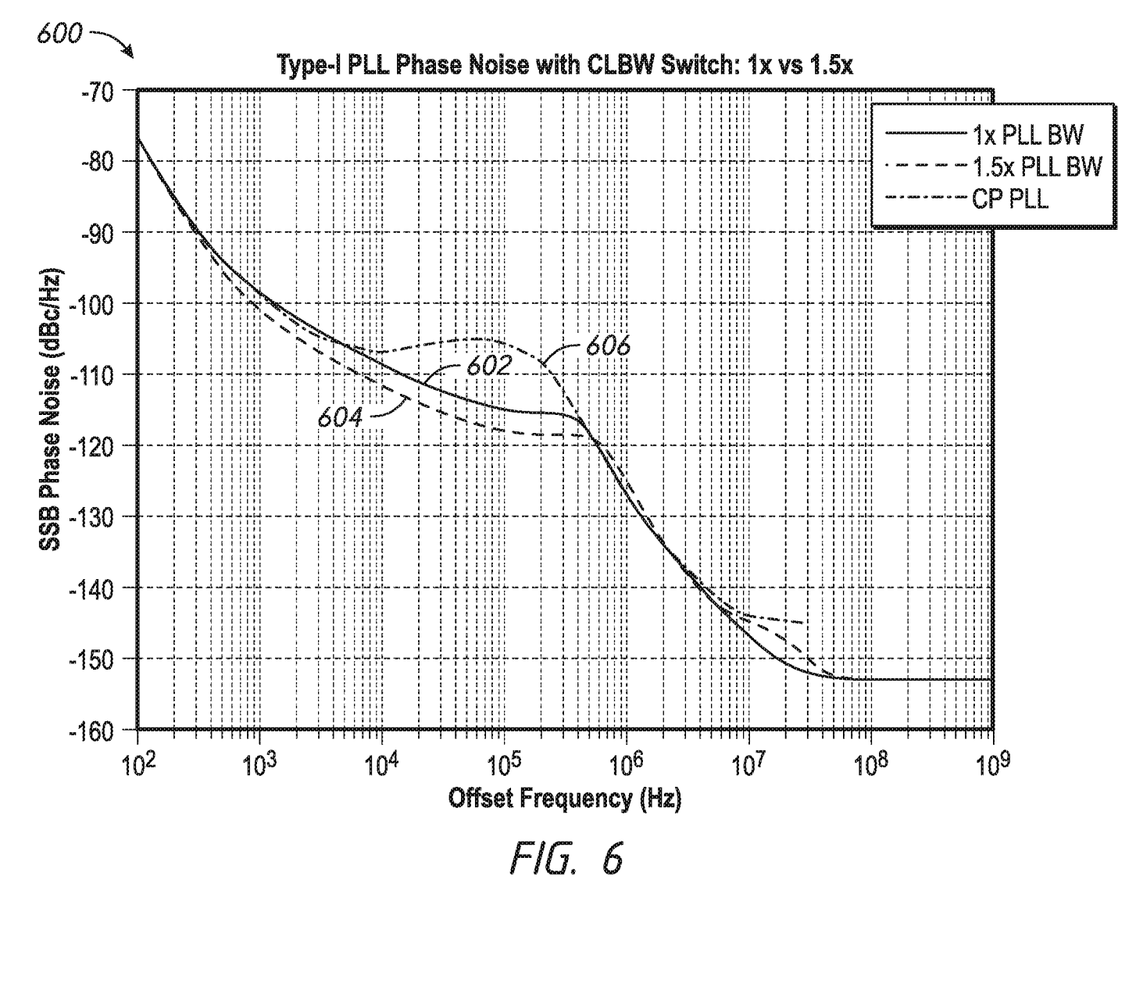
FIG. 6 compares a plot of a phase noise for a Type-I PLL for BW1 to a plot of phase noise for a Type-I PLL for BW2 to a plot of phase noise for a Type-II charge pump (CP) PLL with respect to the offset frequency according to an embodiment.

FIG. 6 is a graph 600 that compares a plot of a phase noise for a Type-I PLL for BW1 602 to a plot of phase noise for a Type-I PLL for BW2 604 to a plot of phase noise for a Type-II charge pump (CP) PLL 606 with respect to the offset frequency according to an embodiment.

The parameters of the Type-I PLL used for the phase noise analysis of FIG. 6 are tabulated in Table 2.

TABLE 2

Type-I XOR PLL Loop Parameters

| Parameter | Value |
| --- | --- |
| Reference Frequency | 52 MHz |
| Reference Noise Model | −150 dBc/Hz Floor |
| $V_{DD}$ | 1.2 V |
| Loop Order | 4 |
| Loop Filter Order | 3 |
| $K_{PD}$ | $V_{DD}/\pi$ |
| $K_V$ | 40 MHz/V |
| BW2 | 750 kHz |
| BW1 | 500 kHz |
| VCO Center Frequency | 1.8 GHz |
| VCO PN @ 10 kHz (Flicker Asymptote) | −74 dBc/Hz |
| VCO PN @ 10 MHz (Thermal Asymptote) | −143 dBc/Hz |
| Fractional-N Modulator | $3^{rd}$ Order MASH |

Referring to FIG. 6, the phase noise plots 602, 604, 606 are at fVCO/2=approximately 900 MHz for comparison with CP PLL data. '1×PLL BW' corresponds to BW1 602, and '1.5×PLL BW' corresponds to BW2 604.

Figure 7:
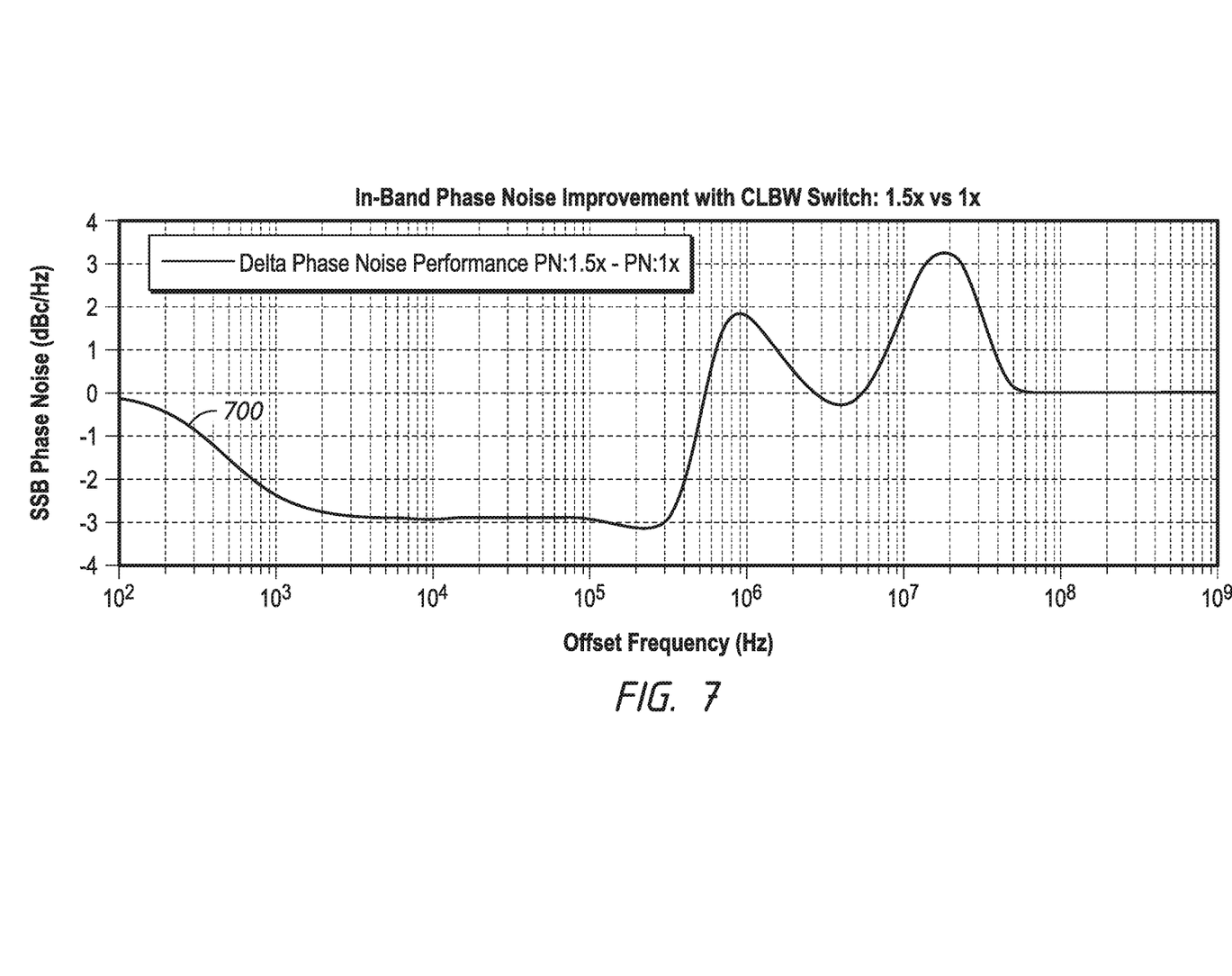
FIG. 7 is a plot of the difference in phase noise between the Type-I PLL for BW1 and BW2 with respect to the offset frequency according to an embodiment.

FIG. 7 is a plot 700 of the difference or delta in phase noise between the Type-I PLL for BW1 and BW2 of FIG. 6 with respect to the offset frequency. At close-in frequencies up to the closed loop bandwidth, for example, the 6.25 kHz offset for Adjacent Channel Rejection, there is approximately 3 dB of enhancement when the bandwidth is switched from BW1 to BW2. At far out frequencies, peaking at approximately a 20 MHz offset, the phase noise is degraded by approximately 3 dB due to less filtering of MASH quantization noise. At intermediate frequencies, around approximately a 1 MHz offset, there is approximately a 2 dB degradation due to the change in location of phase noise peaking around the PLL BW corner frequencies in BW2 versus BW1. According to aspects of the receiver lineup design, interferers are sufficiently filtered for offsets >approximately 1 MHz, such that BW2 is not selected.

Figure 8:
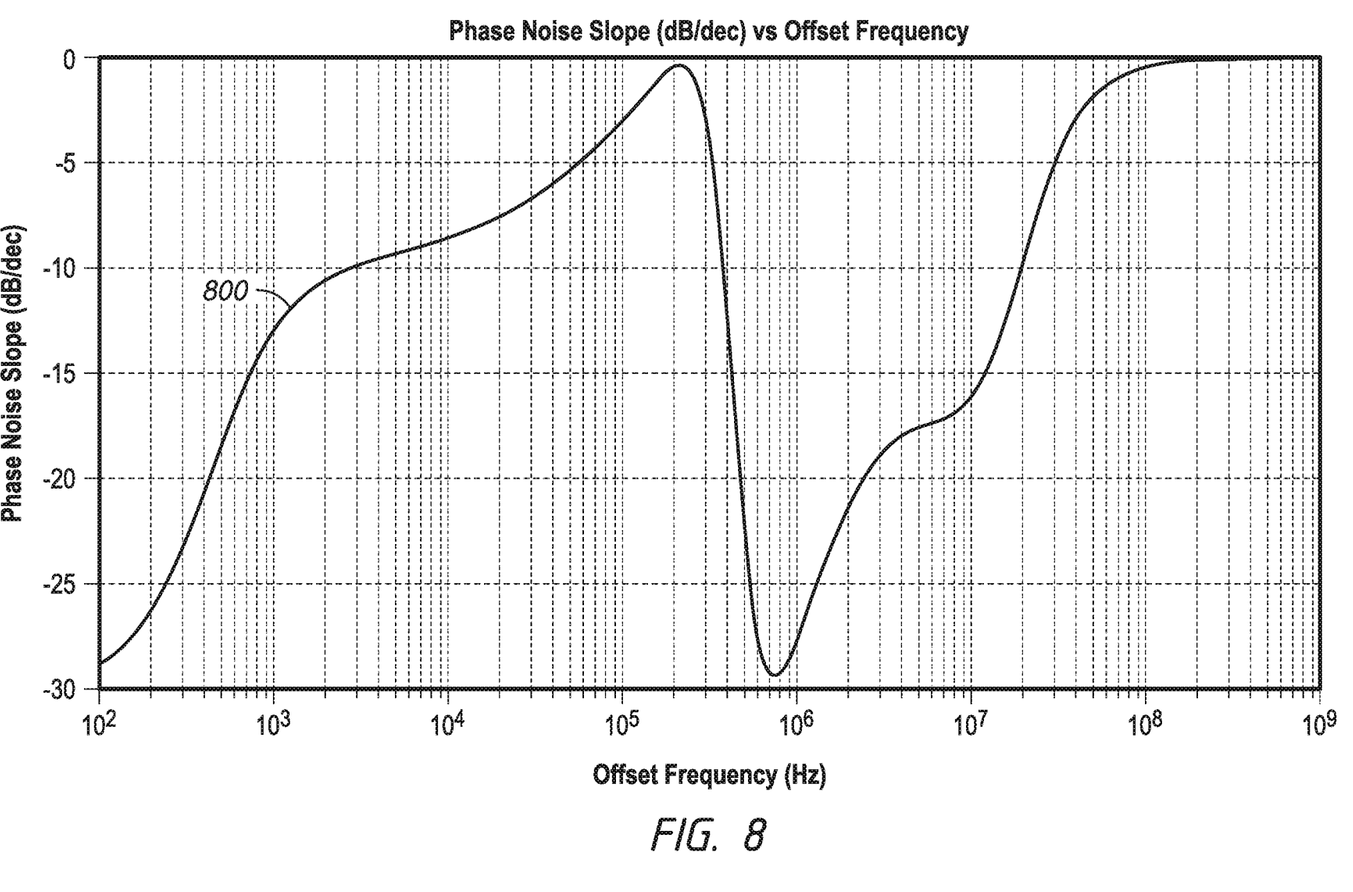
FIG. 8 is a plot of the phase noise slope with respect to offset frequency for a Type-I PLL for BW1 according to an embodiment.

FIG. 8 is a plot 800 of the slope of the phase noise profile with respect to offset frequency for a Type-I PLL for BW1 according to an embodiment. In the MHz offset region, the phase noise profile of the LO rolls off at a rate between approximately −30 dB/decade and approximately −15 dB/decade. For receiver blocking to be limited by phase noise in this region, it is useful to have the receiver filtering characteristic rolling off faster than the phase noise roll off. For example, $2^{nd}$ order filtering characteristics, such as approximately −40 dB/decade, would be reasonable, but there are also considerations about handling interferers at the maximum rated level (usually approximately 3 dB or more lower than the approximately 1 dB compression point of the receiver chain, without triggering the PLL BW switch mechanism. This facilitates the phase noise limited blocker rejection in the far-out region.

Figure 9:
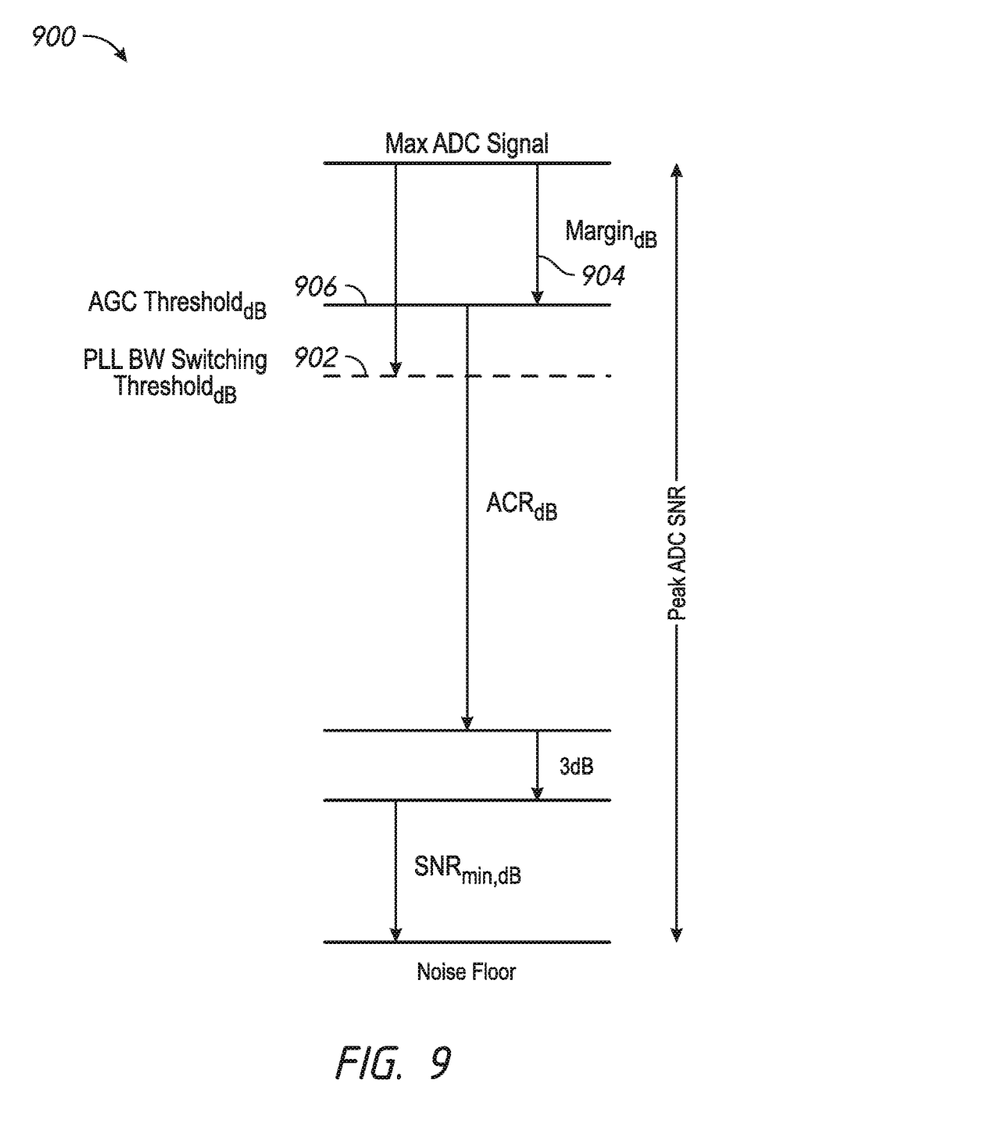
FIG. 9 is a representation of the analog to digital converter dynamic range allocation and phase-locked loop bandwidth switching threshold according to an embodiment.

FIG. 9 is a representation 900 of the ADC dynamic range allocation and PLL BW switching threshold 902 according to an embodiment. The decision threshold can be set at the ADC for engaging a PLL bandwidth switch operation between BW1 and BW2. The PLL bandwidth decision threshold can be set by a digital comparator determining whether the power at the ADC output is greater than a limit, such as a programmable limit. In certain aspects, the limit can be approximately 3 dB below the level corresponding to the first adjacent channel interferer triggered AGC gain change. The receiver anti-aliasing filtering pre-ADC can attenuate far-out interferers below this threshold up to and including the maximum interferer power specification at the frequencies where the increased PLL BW is no longer beneficial.

Referring to FIG. 9, a headroom margin 904 for ADC dynamic range can be allocated, setting an interferer based AGC threshold 906 at the ADC output. Given that the phase noise enhancement can be approximately 3 dB within the PLL bandwidth, the PLL bandwidth switch threshold 902 can be set at approximately 3 dB below the interferer based AGC threshold 906. If the power exceeds the PLL bandwidth switch threshold 902, the PLL bandwidth is switched from BW1 to BW2.

It can be undesirable for the PLL bandwidth to be switched in the presence of far-out interferers. To avoid this, for the maximum specified absolute power for an interferer (PInt, max), the receive chain anti-aliasing filtering can attenuate an interferer below PLL bandwidth switch threshold 902 by approximately 1 MHz offset. In other aspects, other offsets can be used. This can set a criterion for the maximum allowable lineup gain prior to reduction by AGC. If the final lineup gain is less than or equal to this limit, this consideration can be satisfied. This can set a constraint to be satisfied by lineup filtering.

$$A_{V,dB} = S_{ADC\_max,dBm} - P_{Int_{max},dBm} - |H_{Filt,dB}| - \text{Threshold}_{dB}$$

where:

$A_{V,dB}$ is the receiver gain in the passband;

$S_{ADC\_max,dBm}$ is the maximum allowable signal for peak SNR at the ADC input, expressed as an equivalent power in a reference impedance of 50 ohms;

$P_{Int\_max,dBm}$ is the max absolute interferer power;

$H_{Filt,dB}$ is the attenuation of the filter at 1 MHz offset; and $\text{Threshold}_{dB}$ is the PLL bandwidth switch threshold with respect to $S_{ADC\_max,dBm}$.

In aspects of the disclosure, hysteresis can be incorporated into the PLL bandwidth switching decision threshold.

A relationship can be derived between the maximum allowable lineup gain for a target Adjacent Channel Rejection, subject to the constraint of maximum ADC input swing at peak SNR. For simplicity, it can be assumed that there is no significant adjacent channel filtering prior to the ADC, and that receiver BW=DR.

$$A_{V,dB} = S_{ADC\_max,dBm} - \text{Margin}_{dB} - ACR_{dB} -$$
$$(SNR_{min,dB} + 3) - 10\log_{10}\frac{kT}{1\,\text{mW}} - 10\log_{10}DR - NF_{dB}$$

where:

$A_{V,dB}$ is the receiver gain in the passband;

$S_{ADC\_max,dBm}$ is the maximum allowable signal for peak SNR at the ADC input expressed as an equivalent power in a reference impedance of 50 ohms;

$\text{Margin}_{dB}$ is the headroom allocation in the ADC for fading/multi-Interferer effects;

$ACR_{dB}$ is the Adjacent Channel Rejection specification;

$SNR_{min,dB}$ is the minimum Signal-to-Noise ratio for a reference bit error rate;

k is Boltzmann's constant;

T is temperature in Kelvin;

DR is data rate; and $NF_{dB}$ is the receive noise figure.

A quick expression for $S_{ADC\_max,dBm}$ can be arrived at considering supply and MOS device constraints, and assuming differential operation:

$$S_{ADC\_max,dBm} = 10\log_{10}\frac{(V_{DD} - 2V_{dsat})^2}{2 \cdot 50 \cdot 1\,\text{mW}}$$

An estimate for $H_{Filt,dB}$ at 1 MHz can be obtained by considering filter order and the ratio of 3 dB corner frequency to 1 MHz. For example, a Butterworth filter can be used.

$$|H_{Filt,dB}| \approx \text{Order} \cdot 20_{dB/dec} \cdot \log_{10}\frac{1\,\text{MHz}}{f_c}$$

Representative values used for analysis are tabulated below:

TABLE 3

Receiver Lineup Parameters for Max Allowable Gain constraint study

| Parameter | Value |
|---|---|
| $V_{DD}$ | 1.0 V |
| $V_{dsat}$ | 0.2 V |
| $P_{Int\_max,\,dBm}$ | −20 dBm |
| $f_c$ | 150 kHz |
| $\text{Margin}_{dB}$ | 6 dB |
| $\text{Threshold}_{dB}$ | 9 dB |

Figure 10:
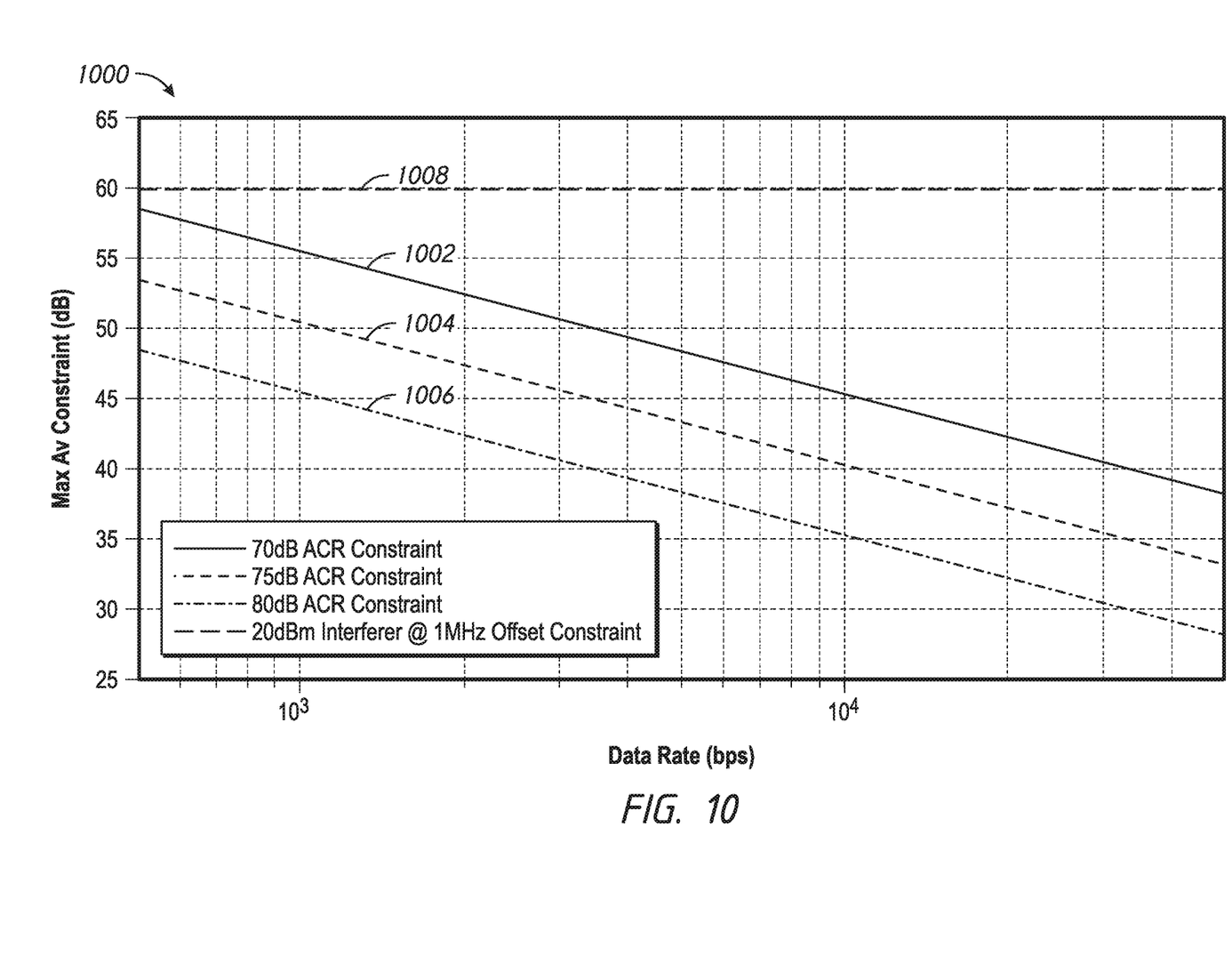
FIG. 10 is compares plots of maximum gain constraints due to adjacent channel rejection (ACR) and far out interferer rejection specifications with respect to data rate according to an embodiment.

FIG. 10 is a graph 1000 that compares plots of maximum gain constraints due to adjacent channel rejection (ACR) and far out interferer rejection specifications with respect to data rate. Plotting the above relationships provides plots 1002, 1004, and 1008. Plot 1002 illustrates an approximately 70 dB ACR constraint versus data rate; plot 1004 illustrates an approximately 75 dB ACR constraint versus data rate, and plot 1006 illustrates an approximately 80 dB ACR constraint versus data rate. Plot 1008 illustrates an approximately −20 dBm interferer at a 1 MHz offset constraint versus data rate.

From the plots 1002, 1004, 1006, and 1008, the maximum gain allowable determined by ACR specifications can be less than that resulting from the capability to handle a maximum power interferer at approximately 1 MHz without inducing a PLL bandwidth switch. In other words, out of band interferer resilience can be maintained.

Figure 11:
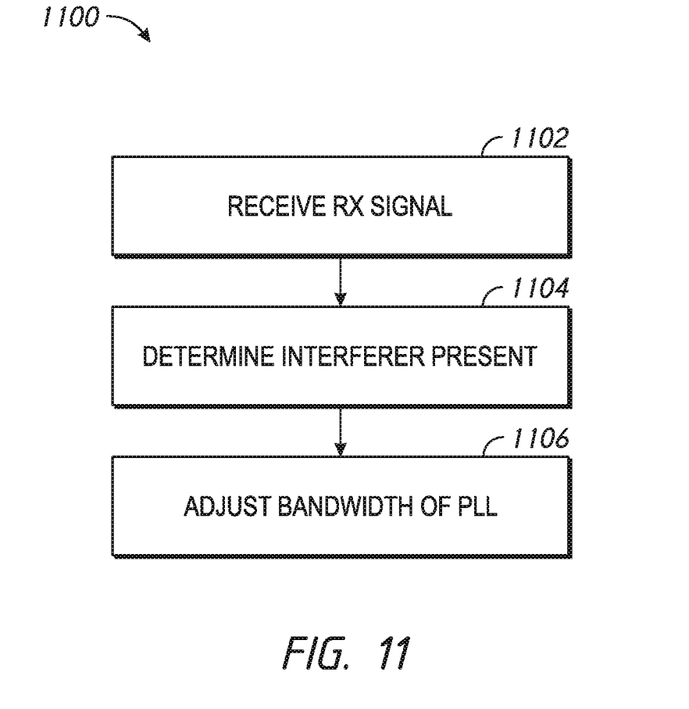
FIG. 11 is a flowchart illustrating a process to adjust the BW of a PLL in receivers and transceivers according to an embodiment.

FIG. 11 is a flowchart illustrating a process 1100 to adjust the BW of a PLL in receivers and transceivers to enhance ACR and blocking performance of the receivers and transceivers according to an embodiment. By default, the process 1100 can operate the PLL generating the LO signal at a first bandwidth, BW1, which is set to optimize far-out interferer block resilience.

The BW of the PLL 116, 200 can be set to BW1, where BW2>BW1. BW1 can be the default setting for the PLL BW. The PLL BW switch logic 114 or the PLL BW control circuitry 232 can set switches SW1-SW6 in the loop filter 304 to provide a PLL BW of BW1, where BW2>BW1, such as setting the switches SW1-SW6 to form loop filter configuration 400. In other aspects, other configurations of loop filters 208 can be used to provide the lower BW of the two BWs to the PLL.

At block 1102, the receiver, such as VLIF receiver 100, can receive the RX signal. The interferer detector 112 or the PLL BW control circuitry 232 can receive the output of the ADC 110. The decision to switch the PLL BW can be driven by information prior to channel select filtering. In certain aspects, decision to switch the PLL BW is only driven by information at prior to channel select filtering.

At block 1104, the process 1100 determines whether an interferer is present in the receive signal. The output of the ADC 110 can provide an indication of the power level of the receive signal. The interferer detector 112 or the PLL BW control circuitry 232 can include a comparator that compares the power of the signal at the ADC output with a limit 902. The comparator can be a digital comparator. The limit 902 can be a programmable limit. The limit 902 can be approximately 3 dB below the level corresponding to the first adjacent channel interferer triggered AGC gain change. If no interferer is detected, the process 1100 can return to block 1102. If an interferer is detected, the process 1100 can move to block 1106.

At block 1106, the process 1100 adjusts the bandwidth of the PLL 116, 200. The process 1100 can adjust the bandwidth of the PLL 116, 200 based on the power level of the receive signal. The PLL BW switch logic 114 or the PLL BW control circuitry 232 can adjust the bandwidth of the PLL 116, 200 based on the indication of the power level of the receive signal at the output of the ADC 110. The PLL BW switch logic 114 or the PLL BW control circuitry 232 can increase the bandwidth of the PLL 116, 200 from BW1 to BW2, where BW2>BW1, when an interferer is detected. The PLL BW switch logic 114 or the PLL BW control circuitry 232 can set switches SW1-SW6 in the loop filter 304 to form a loop filter that increases the PLL BW to BW2, where BW2>BW1, such as setting the switches SW1-SW6 to form loop filter configuration 500. In other aspects, other configurations of loop filters 208 can be used to provide the higher BW of the two BWs to the PLL.

From block 1106, the process 1100 can move to block 1102. In some aspects, the receiver can reset the PLL BW to the default PLL BW when the PLL BW has been increased at block 1106 due to the detection of an interferer at block 1104. When the default PLL BW is to be applied after having been increased, the PLL BW switch logic 114 or the PLL BW control circuitry 232 can set SW1-SW6 in the loop filter 304 to decrease the PLL BW to BW1, where BW2>BW1, such as setting the switches SW1-SW6 to form loop filter configuration 400. In other aspects, other configurations of loop filters 208 can be used to provide the lower BW of the two BWs to the PLL. In other aspects, the receiver can maintain the increased PLL BW when the PLL BW has been increased at block 1106 due to the detection of an interferer at block 1104 until the interferer is no longer present at block 1104.

The process 1100 loops between blocks 1102-1106, increasing the PLL BW to BW2 when an interferer is present and decreasing the PLL BW to BW1 when an interferer is not present, where BW2>BW1.

Thus, in certain aspects, a VLIF receiver includes a Type-I PLL, which can have a faster settling time than an equivalent BW Type-II PLL. The receiver can determine whether an interferer is present based on the power-levels of the receive signal prior to digital channel filtering, such as at the output of the analog to digital converter in the signal path. By basing the decision to switch the BW of the PLL on the pre-filter signal instead of on a comparison of the pre-digital channel filtering and post-digital channel filtering, the receiver can avoid the often significant group delay response introduced by stringent, high order channel filtering, which can facilitate faster packet acquisition. Also envelope ringing effects due to high-Q filtering can be avoided. The envelope ringing effects would further delay the decision to switch PLL bandwidth. In response to detecting an interferer, the receiver increases the BW of the PLL. By increasing PLL BW rather than decreasing it, close in phase noise can be reduced to optimize Adjacent Channel Rejection. By increasing PLL BW rather than decreasing it, the re-settling time incurred in the PLL can be reduced.

Methods, circuits, and systems to significantly enhance ACR and blocking performance of receivers and transceiver are disclosed. Improvements to the ACR and blocking performance disclosed herein can apply to any receiver and transceiver. Examples of circuits for loop filters in PLLs and PLL BW control circuitry are described. Simulated results of the ACR and blocking performance are provided.

Any of the principles and advantages discussed herein can be applied to other systems, circuits, and methods, not just to the systems, circuits, and methods described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Some of the embodiments described above have provided examples in connection with Type-I PLLs. However, any suitable principles and advantages of the embodiments can be applied to charge pump PLLs and Type-II PLLs as appropriate. More generally, any of the principles and advantages discussed herein can be implemented in connection with any other systems, apparatus, or methods that benefit could from any of the teachings herein. For instance, any of the principles and advantages discussed herein can be implemented in connection with any devices with a need for improved adjacent channel rejection.

Aspects of this disclosure can be implemented in various electronic devices. For instance, one or more receivers implemented in accordance with any of the principles and advantages discussed herein can be included in various electronic devices. Examples of the electronic devices can include, but are not limited to, radar systems, radar detectors, consumer electronic products, parts of the consumer electronic products such as semiconductor die and/or packaged modules, electronic test equipment, wireless communication devices, medical devices and/or medical systems, industrial electronics systems, a vehicular electronics system such as an automotive electronics system, etc. Examples of the electronic devices can also include communication networks. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A phase-locked loop having adjustable bandwidth to enhance adjacent channel rejection and blocking performance, the phase-locked loop configured to provide an oscillator signal for demodulating a receive signal in a radio frequency receiver, the phase-locked loop comprising:
   a phase detector comprising an output;
   a loop filter comprising an input in communication with the output of the phase detector, the loop filter configured to modify interferer blocking resilience of the radio frequency receiver by modifying a phase noise profile of the oscillator signal; and
   a bandwidth control circuit configured to operate the loop filter in a first configuration having a first bandwidth in response to no interferer being detected in the receive signal, the first configuration of the loop filter configured to enhance far-out interferer blocking resilience of the radio frequency receiver, the bandwidth control circuit further configured to operate the loop filter in a second configuration having a second bandwidth in response to an interferer being detected in the receive signal, the second configuration of the loop filter configured to enhance close-in interferer blocking resilience of the radio frequency receiver, the second bandwidth being greater than the first bandwidth.

2. The phase-locked loop of claim 1 wherein the phase-locked loop is a Type-I phase-locked loop.

3. The phase-locked loop of claim 1 further comprising an oscillator in communication with the loop filter, the oscillator configured to generate an oscillating waveform based on an output of the loop filter.

4. The phase-locked loop of claim 1 wherein the loop filter comprises at least one switch.

5. The phase-locked loop of claim 4 wherein the bandwidth control circuit controls a state of the at least one switch in response to detecting the interferer.

6. The phase-locked loop of claim 1 wherein the bandwidth control circuit controls a bandwidth of the loop filter by controlling a configuration of the loop filter.

7. The phase-locked loop of claim 1 wherein the second bandwidth is approximately 1.5 times greater than the first bandwidth.

8. The phase-locked loop of claim 1 further comprising a delta-sigma multi-stage noise shaping (MASH) modulator in communication with an input of the phase detector.

9. The phase-locked loop of claim 1 wherein the loop filter comprises at least one switch, at least one resistor and at least one capacitor, and the bandwidth control circuit control the state of the at least one switch based at least in part on the detection of an interferer to control a configuration of the at least one resistor and the at least one capacitor in the loop filter.

10. The phase-locked loop of claim 1 wherein operating the loop filter at the first bandwidth enhances the far-out interferer blocking resilience.

11. The phase-locked loop of claim 1 wherein operating the loop filter at the second bandwidth reduces close-in phase noise to enhance adjacent channel rejection.

12. A method to adjust the bandwidth of a phase-locked loop in a receiver to enhance adjacent channel rejection and blocking performance of the receiver, the phase-locked loop configured to provide an oscillator signal for demodulating a receive signal in the receiver, the method comprising:
   operating a loop filter of the phase-locked loop in a first configuration having a first bandwidth in response to no interferer being detected in the receive signal;
   detecting an interferer in the receive signal prior to channel select filtering; and
   operating the loop filter in a second configuration having a second bandwidth that is greater than the first bandwidth in response to detecting the interferer in the receive signal.

13. The method of claim 12 wherein the receiver is a very low intermediate frequency (VLIF) receiver.

14. The method of claim 12 wherein the phase-locked loop is a Type-I phase-locked loop.

15. The method of claim 12 further comprising operating the phase-locked loop at a default bandwidth when no interferer is detected.

16. The method of claim 12 wherein increasing the bandwidth of the phase-locked loop comprises increasing the bandwidth from a default bandwidth in the receiver in response to detecting the interferer.

17. A receiver with adaptive phase noise, the receiver comprising:
an antenna configured to transmit and receive radio frequency signals;
an interferer detector configured to detect interferers in a received radio frequency signal; and
a phase-locked loop configured to generate an oscillator signal for use in demodulating the received radio frequency signal, the phase-locked loop including a phase detector comprising an output, a loop filter comprising an input in communication with the output of the phase detector, wherein the loop filter is configured to modify interferer blocking resilience of the receiver by modifying a phase noise profile of the oscillator signal, and a bandwidth switch circuit configured to adjust a bandwidth of the phase-locked loop to a first bandwidth in response to not detecting the interferer in the receive signal to enhance far-out interferer blocking resilience of the receiver, and to adjust the bandwidth of the phase-locked loop to a second bandwidth that is greater than the first bandwidth in response to detecting the interferer in the receive signal to enhance close-in interferer blocking resilience of the receiver.

18. The receiver of claim 17 wherein the interferer detector detects a signal strength of the received radio frequency signal in a receive signal path prior to channel detect filtering.

19. The receiver of Claim 17 further comprising an analog to digital converter configured to digitize a demodulated signal in a receive signal path, the interferer detector in communication with an output of the analog to digital converter.

20. The receiver of claim 17 further comprising a low noise amplifier configured to amplify the received radio frequency signal and an automatic gain control circuit configured to adjust a gain of the low noise amplifier based at least in part on a power level of the detected interferers.

\* \* \* \* \*